(12) United States Patent
Iwasaki et al.

(10) Patent No.: US 6,351,686 B1
(45) Date of Patent: Feb. 26, 2002

(54) SEMICONDUCTOR DEVICE MANUFACTURING APPARATUS AND CONTROL METHOD THEREOF

(75) Inventors: Junji Iwasaki; Atsushi Fujisaki; Tomohiro Yamaguchi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/610,702

(22) Filed: Jul. 5, 2000

(30) Foreign Application Priority Data

Jan. 4, 2000 (JP) ........................................ 2000-000044

(51) Int. Cl.$^7$ ................................................ G06F 7/00
(52) U.S. Cl. ...................................... 700/228; 700/121
(58) Field of Search ................................ 700/213, 214, 700/218, 228, 95, 100, 101, 112, 113, 121

(56) References Cited

U.S. PATENT DOCUMENTS

| | | | |
|---|---|---|---|
| 5,195,041 A | * 3/1993 | George et al. | 364/468 |
| 5,375,061 A | * 12/1994 | Hara et al. | 364/468 |
| 5,668,733 A | * 9/1997 | Morimoto et al. | 364/488 |
| 5,867,388 A | * 2/1999 | Okumura et al. | 364/468.19 |
| 6,134,482 A | * 10/2000 | Iwasaki | 700/121 |

FOREIGN PATENT DOCUMENTS

| | | |
|---|---|---|
| JP | 6-291006 | 10/1994 |
| JP | 9-148210 | 6/1997 |
| JP | 11-121582 | 4/1999 |

* cited by examiner

Primary Examiner—Christopher P. Ellis
Assistant Examiner—Khoi H. Tran
(74) Attorney, Agent, or Firm—McDermott, Will & Emery

(57) ABSTRACT

A semiconductor device manufacturing apparatus and a control method thereof which can shorten the manufacturing term of semiconductor devices are achieved. The semiconductor device manufacturing apparatus includes a plurality of processing apparatuses for taking out and processing semiconductor wafers successively which constitute a process lot, and including a standby port where a lot to be processed following processing of the process lot is put on standby. The semiconductor device manufacturing apparatus further includes a stocker for storing a lot to be transported to the standby port. According to the control method of the semiconductor device manufacturing apparatus, it is predicted when there is no standby wafer left in the processing apparatus in a prediction step. The predicted time is used to set transfer starting time when transfer of the next-processed lot to the standby port is started in a time setting step. A lot to be processed next is selected in a lot selecting step. The next-processed lot is transported to the processing apparatus at or after the transfer starting time in a transfer step.

10 Claims, 13 Drawing Sheets

FIG.10
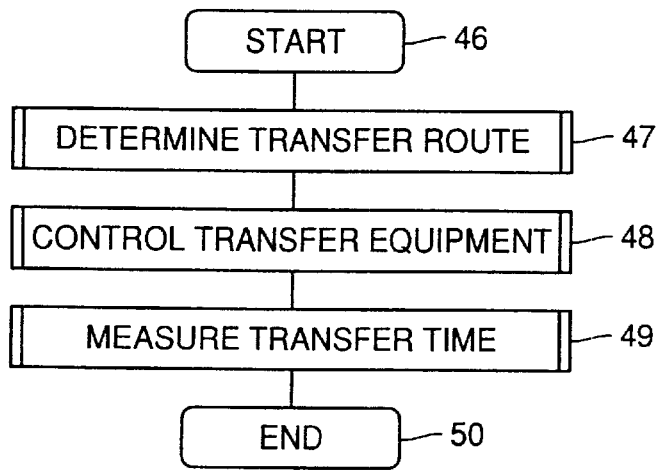
FIG.11
| TRANSFER SOURCE | DESTINATION | TRANSFER TIME |
|---|---|---|
| ⋮ | ⋮ | ⋮ |
FIG.12
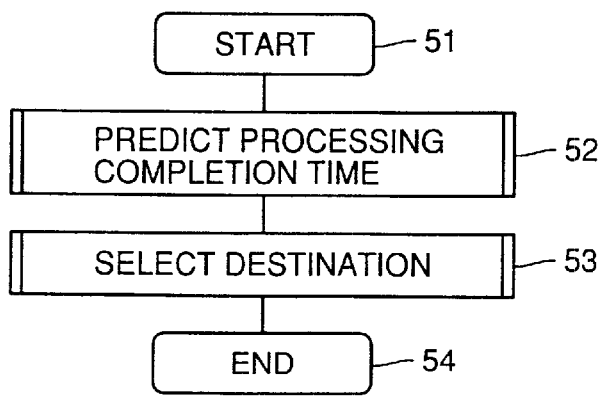

| LOT ID | NEXT STEP | CURRENT STEP COMPLETION TIME | WORKING LOCATION |
|---|---|---|---|
| ⋮ | ⋮ | ⋮ | ⋮ |

| LOT ID | NEXT STEP | CURRENT STEP COMPLETION TIME | TRANSFER TIME | ARRIVAL TIME |
|--------|-----------|------------------------------|---------------|--------------|
| ⋮ | ⋮ | ⋮ | ⋮ | ⋮ |

SEMICONDUCTOR DEVICE MANUFACTURING APPARATUS AND CONTROL METHOD THEREOF

BACKGROUND OF THE INVENTION

1. Field of the Invention

The present invention relates to semiconductor device manufacturing apparatuses and control methods thereof. In particular, the invention relates to a semiconductor device manufacturing apparatus and a control method thereof which enable an efficient transportation of a process lot consisting of semiconductor wafers to be processed.

2. Description of the Background Art

Semiconductor devices such as a semiconductor memory device as a representative one have conventionally been manufactured through process steps in which the surface of a semiconductor wafer is subjected to various treatments such as film deposition and etching. A manufacturing apparatus for the semiconductor devices is thus constituted of various equipment and units such as a processing apparatus for film deposition and transfer equipment for transporting a semiconductor wafer as described below.

FIG. 17 is a perspective view showing a processing apparatus employed in a semiconductor device manufacturing apparatus for processing a semiconductor wafer. The processing apparatus is now described in conjunction with FIG. 17.

Referring to FIG. 17, processing apparatus 104 includes load ports 105a and 105b, load lock chambers 106a and 106b, a wafer transfer unit 107, a pretreatment chamber 108, and a posttreatment chamber 109. Load lock chambers 106a and 106b are located adjacently to respective load ports 105a and 105b. Pretreatment chamber 108 and posttreatment chamber 109 are located opposite to load lock chambers 106a and 106b with wafer transfer unit 107 therebetween.

Load ports 105a and 105b receive, from the outside of processing apparatus 104, a semiconductor wafer cassette 102 holding a process lot (or lot) consisting of semiconductor wafers 101 to be processed. The lot constituted of semiconductor wafers 101 which is housed in semiconductor wafer cassette 102 is handled as a unit for managing fabrication of a semiconductor device at semiconductor wafer 101.

An operation of processing apparatus 104 is described starting with transport of semiconductor wafer cassette 102 to load port 105b for briefly explaining the operation. A lot consisting of semiconductor wafers 101 is drawn out of semiconductor wafer cassette 102 transported to load port 105b. The lot thus drawn out is held in load lock chamber 106b. The air within load lock chamber 106b is then discharged for processing the semiconductor wafers in a vacuum. The inside of load lock chamber 106b is kept in the vacuum state. Semiconductor wafers 101 in vacuum load lock chamber 106b are taken out one by one and fed into pretreatment chamber 108 by wafer transfer unit 107. In pretreatment chamber 108, semiconductor wafer 101 undergoes first processing. After the first processing in pretreatment chamber 108, semiconductor wafer 101 is transported by wafer transfer unit 107 from pretreatment chamber 108 to posttreatment chamber 109 for undergoing second processing. In posttreatment chamber 109, semiconductor wafer 101 is subjected to the second processing. Semiconductor wafer 101 which has undergone the second processing is returned by wafer transfer unit 107 to load lock chamber 106b. These process steps are successively performed for semiconductor wafers 101 held in load lock chamber 106b which have not been processed. In other words, immediately after a preceding semiconductor wafer 101 which has been processed in pretreatment chamber 108 is transported to posttreatment chamber 109, another semiconductor wafer 101 in load lock chamber 106b is fed into pretreatment chamber 108. In this way, all semiconductor wafers 101 of the lot held in load lock chamber 106b are processed and then transported back to load lock chamber 106b. Air is then supplied into load lock chamber 106b to return it into atmospheric state. After this, the lot consisting of processed semiconductor wafers 101 (processed lot) is transferred from load lock chamber 106b into the original semiconductor wafer cassette 102 held at load port 105b and stored therein. Semiconductor wafer cassette 102 holding the processed lot is transferred from load port 105b to the outside of processing apparatus 104. A series of process steps in processing apparatus 104 for the semiconductor wafers is accordingly completed.

Processing apparatus 104 shown in FIG. 17 has two load ports 105a and 105b and two load lock chambers 106a and 106b placed therein. When a lot constituted of semiconductor wafers 101 currently being processed exists in one load lock chamber 106b, a lot consisting of semiconductor wafers to be processed next (next-processed lot) can be received in the other load lock chamber 106a via load port 105a and wait there. Accordingly, semiconductor wafers 101 can be processed consecutively in pretreatment chamber 108 and posttreatment chamber 109.

FIG. 18 shows an entire structure of the semiconductor device manufacturing apparatus. The semiconductor device manufacturing apparatus has a plurality of bays 172. Bays 172 each treated as a unit for management include a plurality of processing apparatuses 104 as shown in FIG. 17, a stocker 115 containing a semiconductor wafer cassette which houses a lot consisting of semiconductor wafers to be processed in processing apparatuses 104, and an intra-bay transfer apparatus 110 for transferring the semiconductor wafer cassette between stocker 115 and processing apparatus 104 and between processing apparatuses 104. Bays 172 are connected by an inter-bay transfer apparatus 123 which can transport the semiconductor wafer cassette between bays 172. Processing apparatuses 104 include various processing apparatuses such as film deposition equipment and etching equipment for manufacturing a semiconductor device. In a predetermined manufacturing process of the semiconductor device, a semiconductor wafer cassette holding a lot consisting of semiconductor wafers to be processed is transported to predetermined processing apparatuses successively through predetermined process steps for performing predetermined processing on the semiconductor wafers.

Production of a semiconductor device thus requires that a lot consisting of semiconductor wafers to be processed is efficiently transported to various processing apparatuses. A conventional control process employed for transporting such a lot (i.e. a semiconductor wafer cassette holding a lot) is shown in FIG. 19. FIG. 19 shows a flow chart illustrating a lot transfer process in a conventional semiconductor device manufacturing apparatus. This process is controlled by a controller for controlling loading and unloading of a lot to and from processing apparatuses 104. The controller controls processing apparatuses 104; intra-bay transfer apparatus 110 and stocker 115 constituting bay 172 and inter-bay transfer apparatus 123. Details of the process are described in conjunction with FIG. 19.

Referring to FIG. 19, the process starts for each predetermined event (step 131). After the process starts, a dispatch process (step 132) is performed for determining a lot to be processed next (next-processed lot) in processing apparatus 104 being controlled. Simultaneously with the dispatch process (step 132), a retrieve process (step 133) is performed for determining a destination of a lot which has been processed (processed lot) in processing apparatus 104. Subsequently, a transfer execution process (step 134) is conducted. In the transfer execution process (step 134), the next-processed lot which is designated in the dispatch process (step 132) is sent to a load port of the processing apparatus 104, or the processed lot is sent to the determined destination from the load port of the processing apparatus 104. After the transfer process, the process shown in FIG. 19 is completed (step 135). It is noted that no transfer occurs in the transfer execution process (step 134) if the next-processed lot and the destination of the processed lot are not determined in the dispatch process (step 132) and the retrieve process (step 133) respectively.

After the lot transfer process shown in FIG. 19, the next-processed lot is fed to any of load ports 105a and 105b (see FIG. 17) which is vacant in processing apparatus 104. The controller of the semiconductor device manufacturing apparatus then starts a different process in order to start processing of semiconductor wafer 101 in processing apparatus 104. If the processed lot is transported from processing apparatus 104 to stocker 115, for example, the controller performs another process in order to allow the processed lot to be sent to another processing apparatus 104 in bay 172 or a processing apparatus 104 in another bay 172 and undergo next processing therein.

The process shown in FIG. 19 is described below in more detail. FIG. 20 shows a flow chart illustrating details of the dispatch process (step 132) in FIG. 19. The dispatch process is described in conjunction with FIG. 20.

Referring to FIG. 20, the dispatch process (step 132) starts (step 136) to perform a load port vacancy detecting process (step 137) for detecting whether load ports 105a and 105b in any processing apparatus 104 are vacant. If vacancy of load port 105a or 105b is detected, a search is conducted for a lot among lots held in stocker 115 that can be processed in processing apparatus 104. If there are a plurality of lots which can be processed, a lot to be processed next (next-processed lot) in the processing apparatus is determined based on predetermined priorities assigned to respective lots. In this way, a lot selecting process (step 138) is performed. When the next-processed lot is determined, the dispatch process is completed (step 139).

FIG. 21 is a flow chart illustrating details of the transfer execution process (step 134) in FIG. 19. A conventional transfer execution process is described in conjunction with FIG. 21.

According to the conventional transfer execution process, the process starts (step 140) to perform a transfer route determining step (step 141) for determining a transfer route of the next-processed lot designated in the dispatch process (step 132) based on the current position of the next-processed lot and positions of load ports 105a and 105b of processing apparatus 104 in which the next-processed lot is to be processed. Simultaneously, if the destination of the processed lot has been determined in the retrieve process (step 133), a step of determining a transfer route of the processed lot is performed based on the current position of the processed lot and the position of the destination, in the transfer route determining step (step 141).

Next, a transfer equipment control process (step 142) is performed for actually transporting the lot along the determined transfer route. In the transfer equipment control process (step 142), stocker 115 and transfer equipment such as intra-bay transfer apparatus 110 or inter-bay transfer apparatus 123 are controlled. In this way, the next-processed lot is sent to load port 105a or 105b of processing apparatus 104, or the processed lot is sent to stocker 115, for example. The transfer execution process is thereafter completed (step 143).

FIG. 22 shows a flow chart illustrating details of the retrieve process in FIG. 19. A conventional retrieve process (step 133) is described below in conjunction with FIG. 22.

The retrieve process starts (step 144) to perform a processing completion detecting process (step 145) for detecting completion of processing for all semiconductor wafers 101 in a lot including semiconductor wafer 101 being processed in processing apparatus 104 (completion of processing of the lot). When completion of the lot processing is detected, a destination selecting process (step 146) is conducted. In the destination selecting process (step 146), it is determined whether the processed lot is transported to stocker 115 or transported to load port 105a or 105b of another processing apparatus 104 in the same bay 172 in which the processed lot can undergo next processing. After the destination of the processed lot is determined, the process ends (step 147).

In the destination selecting process (step 146), it would be theoretically possible to convey the processed lot directly to load port 105a or 105b of another processing apparatus 104 instead of stocker 115. However, the processed lot can be conveyed directly to another processing apparatus 104 only under the conditions that another processing apparatus 104 is located in bay 172 in which the processed lot exists and that load port 105a or 105b in that another processing apparatus 104 is vacant.

The conventional lot transfer process has following problems.

In the dispatch process (step 132), vacancy of load ports 105a and 105b of processing apparatus 104 is detected (step 137) as shown in FIG. 20 and a next-processed lot is selected on the condition that load port 105a or 105b is vacant. Immediately after the dispatch process (step 132), the transfer execution process (step 134) is conducted to supply the next-processed lot to vacant load port 105a or 105b. Accordingly, in processing apparatus 104 shown in FIG. 17, for example, basically semiconductor wafer cassettes 102 are placed at respective load ports 105a and 105b and lots are placed in respective load lock chambers 106a and 106b all the time. In other words, two lots are loaded in processing apparatus 104. Suppose that one of the two lots which is placed in load lock chamber 106a has been processed. The processed lot is discharged from the processing apparatus so that load port 105a becomes vacant. Then, in the load port vacancy detecting process (step 137) of the dispatch process (step 132), the vacancy of load port 105a is detected. Immediately after this, a lot which can be processed in processing apparatus 104 is selected in the lot selecting process (step 138). The selected lot is quickly fed to load lock chamber 106a via load port 105a in the transfer execution process (step 134). At this time, however, the other lot which has been placed in load lock chamber 106b is being processed in processing apparatus 104. Therefore, during the processing of the other lot, the lot fed from load port 105a to load lock chamber 106a is on standby waiting for processing. In this standby state, even if another processing apparatus can start processing of the standby lot in load lock chamber 106a, no transfer process is done for sending the standby lot to that another processing apparatus. Consequently, the production term of the lot is prolonged.

A next-processed lot is selected on the condition that load port 105*a* or 105*b* is vacant and the next-processed lot is then fed to processing apparatus 104 as described above. Therefore, both of a lot being processed and a lot on standby exist in processing apparatus 104 all the time. In other words, there is always no vacancy in general since respective semiconductor wafer cassettes for those two lots are placed at respective load ports 105*a* and 105*b* of processing apparatus 104. Even if there is another lot having a higher priority than that of the standby lot which has already been loaded in processing apparatus 104, the processing of that another lot with a higher priority in processing apparatus 104 can be started only after processing of the standby lot is completed. Consequently, the lot having a higher priority cannot be processed in a short term.

Generically, there is always no vacancy in load ports 105*a* and 105*b* in the processing apparatus as described above. In one bay 172, if another processing apparatus can perform processing corresponding to the next process step for the lot which has been processed (processed lot) in processing apparatus 104 in that bay 172, the processed lot is not directly transported to that another processing apparatus and sent to stocker 115 instead in most of the cases since load ports of that another processing apparatus are not empty generally. In other words, a lot is transported from one process step to the next process step via stocker 115 in most instances, resulting in a prolonged production term of the lot.

If direct transfer of a lot is possible from a processing apparatus to another processing apparatus without passing the lot through stocker 115, the transfer process may be done once. On the other hand, the conventional lot transfer process requires that the transfer process is performed twice, one for transfering a processed lot to stocker 115 and one for transferring the lot to another processing apparatus which conducts processing in the next process step. Consequently, work load of intra-bay transfer apparatus 110 increases. The increased work load of intra-bay transfer apparatus 110 causes a processed lot or a next-processed lot to wait for being transported. This also results in a prolonged manufacturing term of the lot.

SUMMARY OF THE INVENTION

One object of the present invention is to provide a semiconductor device manufacturing apparatus and a control method thereof which can shorten manufacturing term of semiconductor devices without decrease in the amount of manufactured products.

According to one aspect of the invention, a control method of a semiconductor device manufacturing apparatus is provided which includes a plurality of processing apparatuses which successively draw out and process a plurality of semiconductor wafers constituting a process lot and which include a standby port where a lot is on standby to be processed next (next-processed lot) after processing of the process lot. The manufacturing apparatus further includes a stocker holding a lot to be transported to the standby port. The control method includes a prediction step, a time setting step, a lot selecting step and a transfer step. In the prediction step, it is predicted when processing starts for the last semiconductor wafer among semiconductor wafers which were on standby in the processing apparatus and consequently there is no standby wafer left in the processing apparatus. In the time setting step, using the time when there is no standby wafer left in the processing apparatus, transfer starting time is set for starting transfer of a next-processed lot to the standby port in order to enable successive processing of following semiconductor wafers to start after the last semiconductor wafer is processed. In the lot selecting step, a next-processed lot is selected. In the transfer step, the next-processed lot is transferred to the processing apparatus at or after the transfer starting time.

In this way, the time at which there is no standby wafer left in the processing apparatus is predicted to transfer the next-processed lot to the processing apparatus timely such that successive processing in the processing apparatus is possible. Consequently, the next-processed lot is never fed to the standby port when there remain many unprocessed wafers in a lot being processed. Thus, the next-processed lot is never put on standby at the standby port for a long period of time. In the time period in which the next-processed lot should be on standby at the standby port according to the conventional control method, suppose that another processing apparatus can process the next-processed lot. According to the present invention, the next-processed lot can be transported properly to that another processing apparatus and thus semiconductor wafers can be processed more quickly. As a result, the manufacturing term of semiconductor devices can be shortened without decrease in the amount of manufactured products.

According to the present invention, the next-processed lot would never remain in standby state for a long time at the standby port. Therefore, delay can be avoided in processing for a lot having a high processing priority, which delay is caused by the long-period presence of the next-processed lot at the standby port.

According to the one aspect of the invention, in the lot selecting step of the control method of the semiconductor device manufacturing apparatus, preferably the next-processed lot is selected at or after the transfer starting time.

In this case, the next-processed lot is selected at the time as near as possible to the starting time for processing the next-processed lot in the processing apparatus. The time from selection of a next-processed lot to processing of the next-processed lot can be made shorter than that in the conventional method. Further, the selection of the next-processed lot is made at the time as close as possible to the starting time of the processing of the next-processed lot in the processing apparatus. Then, a lot having a high priority for being processed, which is actually selectable as a next-processed lot at the processing starting time in the processing apparatus but which cannot be selected in the conventional method due to the time limitation, can be selected as a next-processed lot. (Such a high-priority lot is not selected as a next-processed lot in the processing apparatus and put on standby for being processed in another processing apparatus in the conventional method.) The high-priority lot can accordingly be processed in the processing apparatus earlier compared with the conventional method. Reduction of manufacturing term of the high-priority lot is thus ensured.

According to the one aspect of the invention, the control method of the semiconductor device manufacturing apparatus preferably includes the step of predicting the time required for the transfer step (the step of predicting transfer time). The predicted transfer time is preferably used in the time setting step to determine the transfer starting time.

Precise prediction of the transfer time would enable the transfer starting time to be set more accurately. If the transfer starting time is set less accurately, for example, if the determined transfer starting time is too earlier than the optimum time, the next-processed lot should be on standby at the standby port for a long period of time. On the contrary, if the determined transfer starting time is later than the optimum time, the next-processed lot is not in time for being processed in the processing apparatus resulting in the period in which wafers to be processed in the processing apparatus are waited for. If the precision of setting the transfer starting time can be improved, this problem can be avoided. The manufacturing term of the semiconductor device is thus surely shortened.

According to the one aspect of the invention, the control method of the semiconductor device manufacturing apparatus, preferably the transfer time is predicted based on the actual transfer time.

According to the one aspect of the invention, in the control method of the semiconductor device manufacturing apparatus, preferably the step of predicting transfer time includes the steps of measuring the actual transfer time and predicting the transfer time using the actual transfer time.

In this way, the transfer starting time can be determined more precisely by predicting the transfer time based on the actual transfer time.

According to the one aspect of the invention, the control method of the semiconductor device manufacturing apparatus preferably includes the step of predicting when processing is completed for another process lot including a semiconductor wafer being processed in another processing apparatus. In the lot selecting step, the predicted completion time is used to select a next-processed lot, which can be transferred to the standby port, from that another process lot and any lot held in the stocker. As a result, after the last semiconductor wafer has been processed, processing of the next semiconductor wafer can be started successively.

In this case, the next-processed lot can be selected from the group consisting of the another process lot being processed in another processing apparatus and any lot stored in the stocker, so that the another lot being processed in another processing apparatus can be selected as a next-processed lot. Then, the next-processed lot can be transported directly from that another processing apparatus to the processing apparatus. The step in the conventional method of transferring and storing a processed lot into the stocker is thus unnecessary. Shortening of the manufacturing term of the semiconductor device is accordingly achieved.

The number of required transfer steps can be reduced by one compared with the conventional method in which the processed lot is stored in the stocker and then conveyed to the processing apparatus. As a result, reduction is possible of the working load of the transfer equipment which transfers lots between the stocker and the processing apparatus. The problem that standby wafers occur in the processing apparatus due to the high working load of the transfer apparatus is thus prevented. Extension of the manufacturing term of the semiconductor device due to such occurrence of the standby wafers can be avoided.

According to another aspect of the invention, a semiconductor device manufacturing apparatus includes a plurality of processing apparatuses which successively draw out and process a plurality of semiconductor wafers constituting a process lot and which include a standby port where a lot is on standby to be processed next (next-processed lot) after processing of the process lot. The manufacturing apparatus includes a stocker holding a lot to be transported to the standby port. The semiconductor device manufacturing apparatus further includes prediction means, time setting means, lot selecting means and transfer means. The prediction means predicts when processing starts for the last semiconductor wafer among semiconductor wafers which were on standby in the processing apparatus and consequently there is no standby wafer left in the processing apparatus. The time setting means uses the time when there is no standby wafer left in the processing apparatus to set transfer starting time for starting transfer of a next-processed lot to the standby port in order to enable successive processing of following semiconductor wafers to start after the last semiconductor wafer is processed. The lot selecting means selects a next-processed lot. The transfer means transfers the next-processed lot to the processing apparatus at or after the transfer starting time.

In this way, the time when there remains no standby wafer in the processing apparatus is predicted to determine the transfer starting time based on that time and then transfer the next-processed lot to the processing apparatus at or after the transfer starting time at the standby port. Consequently, the next-processed lot is never fed to the standby port when there remain many unprocessed wafers in a lot being processed. Thus, the next-processed lot is never put on standby for a long period of time at the standby port. As a result, the manufacturing term of semiconductor devices can be shortened.

The next-processed lot would never remain in standby state for a long time at the standby port. Therefore, delay can be avoided in processing for a lot having a high processing priority, which delay is caused by the long-period presence of the next-processed lot at the standby port.

According to the another aspect of the invention, preferably the lot selecting means never selects the next-processed lot before the transfer starting time.

In this case, the next-processed lot is selected at the time as close as possible to the starting time for processing the next-processed lot in the processing apparatus. If there is a lot having a higher processing priority, this lot with a high priority can be selected as a lot to be processed next in the processing apparatus, and the lot can thus be processed quickly.

According to the another aspect of the invention, preferably the semiconductor device manufacturing apparatus includes means for predicting the time required for transferring the next-processed lot to the processing apparatus. The predicted transfer time is preferably used by the time setting means to determine the transfer starting time.

Precise prediction of the transfer time would enable the transfer starting time to be set more accurately. If the transfer starting time is away from the optimum time, the next-processed lot should wait for being processed at the standby port for an increased time or there is a wasteful time for waiting for arrival of the lot in the processing apparatus. By avoiding such wasteful time period, the manufacturing term of semiconductor devices can surely be shortened.

According to the another aspect of the invention, the transfer time predicting means preferably uses an actual time for transferring the next-processed lot to the processing apparatus to predict the transfer time.

According to the another aspect of the invention, the transfer time predicting means preferably includes means for measuring the actual transfer time for transferring the next-processed lot by the transfer means to the processing apparatus, and means for predicting the transfer time using the actual transfer time.

In this way, the transfer starting time can be determined more precisely by predicting the transfer time based on the actual transfer time.

According to the another aspect of the invention, the semiconductor device manufacturing apparatus preferably includes means for predicting when processing is completed for another process lot including a semiconductor wafer being processed in another processing apparatus. The lot selecting means uses the predicted completion time to select a next-processed lot, which can be transferred to the standby port, from that another process lot and any lot held in the stocker. As a result, after the last semiconductor wafer has been processed, processing of the next semiconductor wafer can be started successively.

In this case, the next-processed lot can be selected from the group consisting of the another process lot being processed in another processing apparatus and any lot stored in the stocker, so that the another lot being processed in another processing apparatus can be selected as a next-processed lot. Then, the next-processed lot can be transported directly from that another processing apparatus to the processing apparatus. The step of storing a processed lot in the stocker is thus unnecessary. Shortening of the manufacturing term of semiconductor devices is accordingly possible.

The number of required transfer steps can be reduced by one compared with the conventional method. As a result, reduction is possible of the working load of the transfer equipment which transfers lots between the stocker and the processing apparatus. Then, the wasteful time for waiting for a lot in the processing apparatus due to the high working load of the transfer equipment can be avoided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a flow chart illustrating a transfer execution process in a semiconductor device manufacturing apparatus in a second embodiment of the invention.

FIG. 11 shows a data table indicating data items for transfer time data produced in a transfer time measuring process in FIG. 10.

FIG. 12 is a flow chart illustrating a retrieve process in a semiconductor device manufacturing apparatus in a third embodiment of the invention.

DESCRIPTION OF THE PREFERRED EMBODIMENTS

Figure 1:
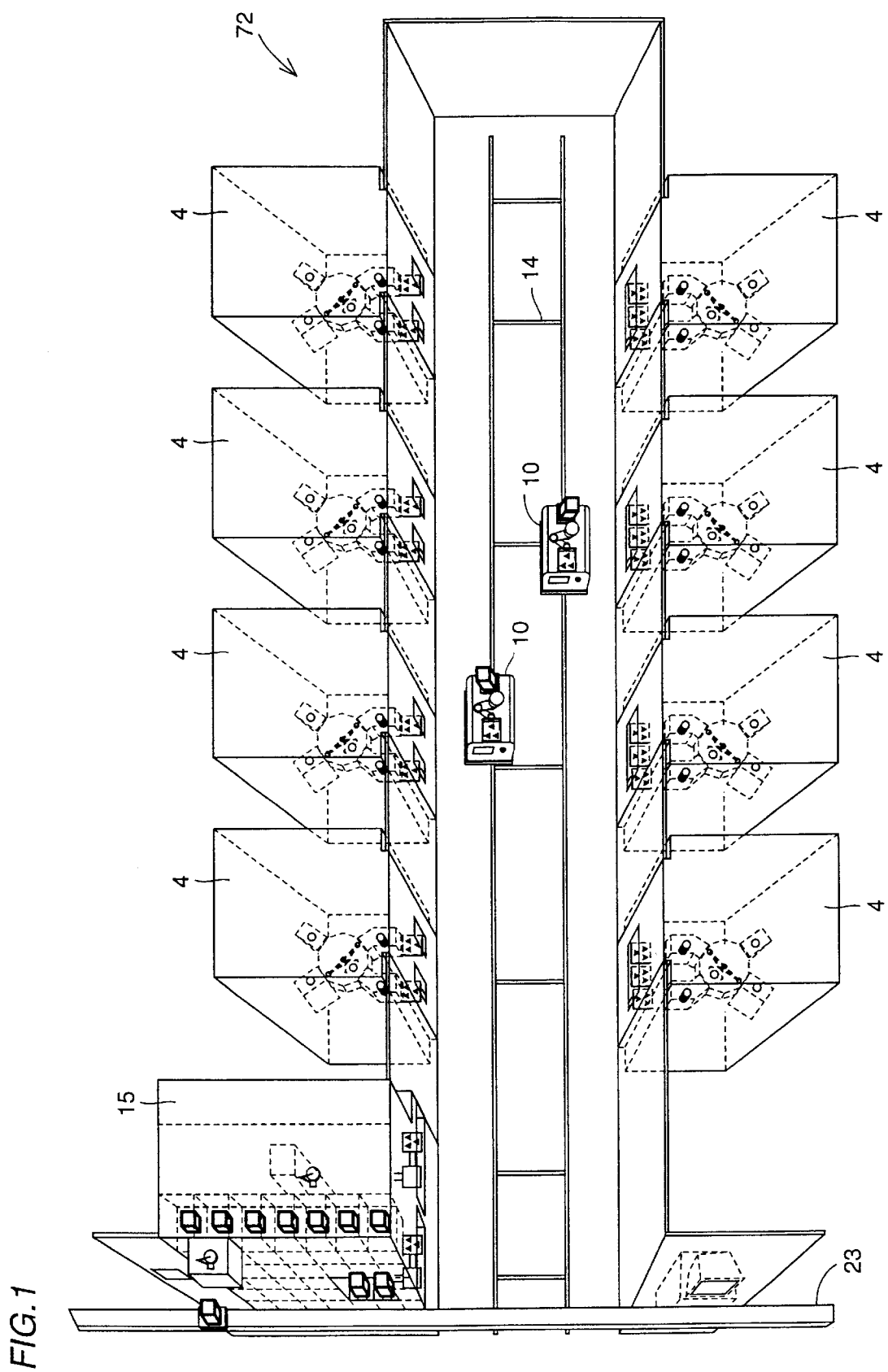
FIG. 1 is a perspective view showing a bay which constitute a semiconductor device manufacturing apparatus according to the present invention.

Embodiments of the present invention are described in conjunction with the drawings. It is noted that the same or corresponding components in the drawings are denoted by the same reference characters and description thereof is not repeated here.

First Embodiment

A semiconductor device manufacturing apparatus is now described in conjunction with FIG. 1.

Referring to FIG. 1, a bay 72 constituting the semiconductor device manufacturing apparatus according to the present invention includes processing apparatuses 4 for conducting processing such as film deposition for a semiconductor wafer, a stocker 15 and an intra-bay transfer apparatus 10. A plurality of processing apparatuses 4 are placed at bay 72. A semiconductor wafer to be processed is transported by intra-bay transfer apparatus 10 between these processing apparatuses 4 and stocker 15. Intra-bay transfer apparatus 10 travels along a guide tape 14. The semiconductor device manufacturing apparatus has a plurality of bays 72 arranged therein which are connected to enable transfer of a semiconductor wafer to be processed between bays 72 by an inter-bay transfer apparatus 23. Processing apparatuses 4, intra-bay transfer apparatuses 10 and stocker 15 constituting bay 72 as well as inter-bay transfer apparatus 23 are controlled by respective controllers of the semiconductor device manufacturing apparatus.

Figure 2:
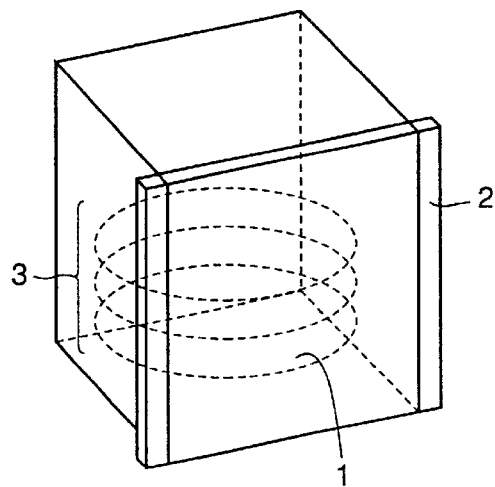
FIG. 2 is a perspective view showing a semiconductor wafer cassette used in the semiconductor device manufacturing apparatus according to the present invention.

In the semiconductor device manufacturing apparatus as shown in FIG. 1, semiconductor wafers are stored in a semiconductor wafer cassette 2 shown in FIG. 2 and transported. Referring to FIG. 2, in the semiconductor device manufacturing apparatus, semiconductor wafers 1 to be processed are divided into lots 3 each consisting of a plurality of wafers to be processed as a unit. Lot 3 is housed in semiconductor wafer cassette 2 and transferred to processing apparatus 4, stocker 15 and the like.

The processing apparatus is described below in conjunction with FIG. 3.

Figure 3:
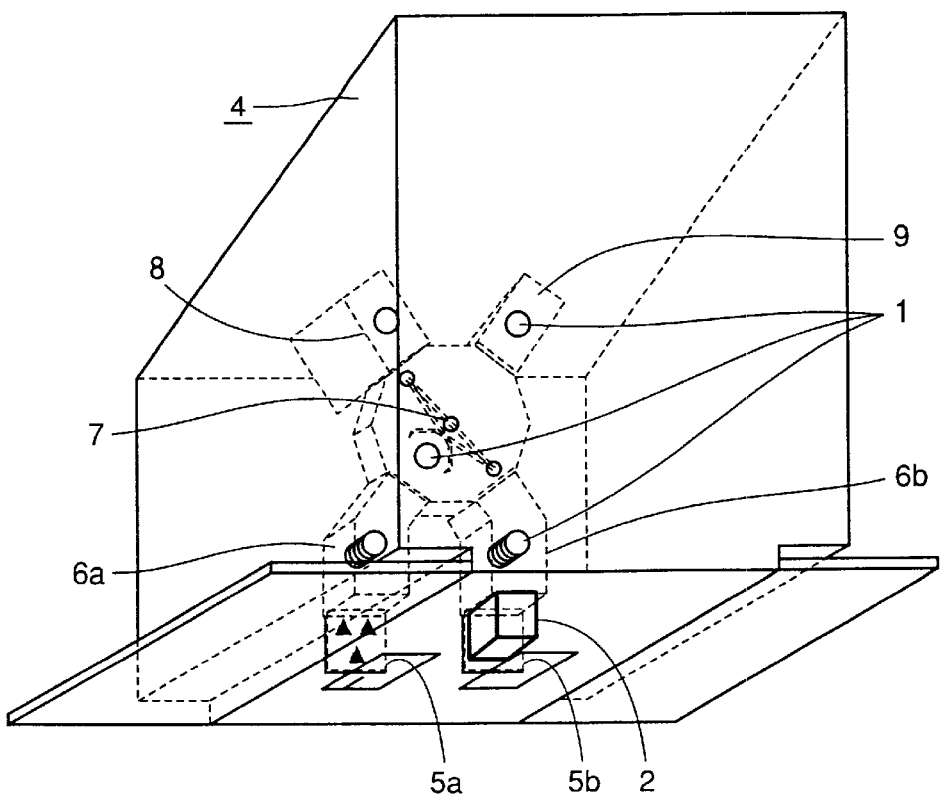
FIG. 3 is a perspective view showing a processing apparatus in FIG. 1.

Referring to FIG. 3, processing apparatus 4 is constituted of load ports 5a and 5b for receiving a semiconductor wafer cassette 2 holding a lot 3 consisting of semiconductor wafers 1 (see FIG. 2), load lock chambers 6a and 6b for receiving lot 3 in the wafer cassette and serving as a vacuum standby port, a pretreatment chamber 8 and a posttreatment chamber 9 for processing semiconductor wafers 1, and a wafer transfer unit 7 for transferring wafers 1 between load lock chambers 6a and 6b, pretreatment chamber 8 and posttreatment chamber 9. Processing apparatus 4 includes two load ports 5a and 5b and two load lock chambers 6a and 6b for successively processing semiconductor wafers 1 in pretreatment chamber 8 and posttreatment chamber 9.

An operation of processing apparatus 4 is described briefly below. Semiconductor wafer cassette 2 which holds lot 3 therein is supplied from the outside of processing apparatus 4 to load port 5b. Lot 3 is then drawn out from wafer cassette 2 and housed in load lock chamber 6b. In order to perform a series of processing steps for semiconductor wafer 1 in vacuum, air is discharged from load lock chamber 6b to keep the inside of load lock chamber 6b in vacuum state. After a vacuum is produced in load lock chamber 6b, semiconductor wafers 1 are taken out from load lock chamber 6b one by one by transfer unit 7. Semiconductor wafer 1 thus taken out is transported first to pretreatment chamber 8 in which a first processing step is performed for semiconductor wafer 1. After the first processing step, semiconductor wafer 1 which has undergone the first processing step is then transported by transfer unit 7 to posttreatment chamber 9 in which a second processing step is done for semiconductor wafer 1. Semiconductor wafer 1 which has undergone the second processing step is returned to load lock chamber 6b by transfer unit 7. In a similar manner, other semiconductor wafers 1 on standby remaining in load lock chamber 6b are transported successively to pretreatment chamber 8 and posttreatment chamber 9 to undergo the first and second processing steps. After all of the semiconductor wafers 1 of lot 3 housed in load lock chamber 6b have been processed and returned to load lock chamber 6b, air is supplied into load lock chamber 6b to produce a normal atmospheric pressure therein. The processed lot 3 consisting of the processed wafers 1 is returned into semiconductor wafer cassette 2 located at load port 5b. After this, wafer cassette 2 holding the processed lot 3 is transported to the outside of processing apparatus 4. In this way, a series of process steps are completed.

Processing apparatus 4 shown in FIG. 3 has two load ports 5a and 5b and two load lock chambers 6a and 6b arranged therein. If a preceding lot 3 which is being processed is present in load lock chamber 6b, for example, another lot may be supplied to load lock chamber 6a as a standby lot. Then, immediately after semiconductor wafers 1 of the lot 3 located in load lock chamber 6b are processed, semiconductor wafer 1 of the standby lot in load lock chamber 6a can be transported to pretreatment chamber 8 in order to continue the first processing for wafers. Consequently, there arises no time to wait for wafers for processing them in pretreatment and posttreatment chambers 8 and 9 of processing apparatus 4 and the processing steps can be conducted successively.

Figure 4:
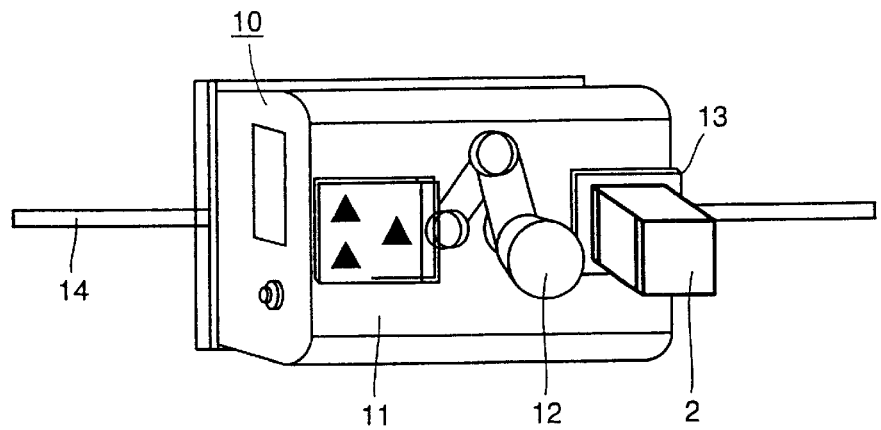
FIG. 4 is a perspective view showing an intra-bay transfer apparatus in FIG. 1.

The intra-bay transfer apparatus is described below in conjunction with FIG. 4. Referring to FIG. 4, intra-bay transfer apparatus 10 includes a carriage 11 and an arm 12. Carriage 11 is freely movable along guide tape 14 placed on the floor in the bay. Arm 12 attached to carriage 11 is used for loading and unloading semiconductor wafer cassette 2 holding lot 3 therein. A loading platform 13 is provided to carriage 11 for carrying wafer cassette 2. Two platforms 13 are provided to the intra-bay transfer apparatus shown in FIG. 4.

The stocker and the inter-bay transfer apparatus are described below in conjunction with FIG. 5.

Figure 5:
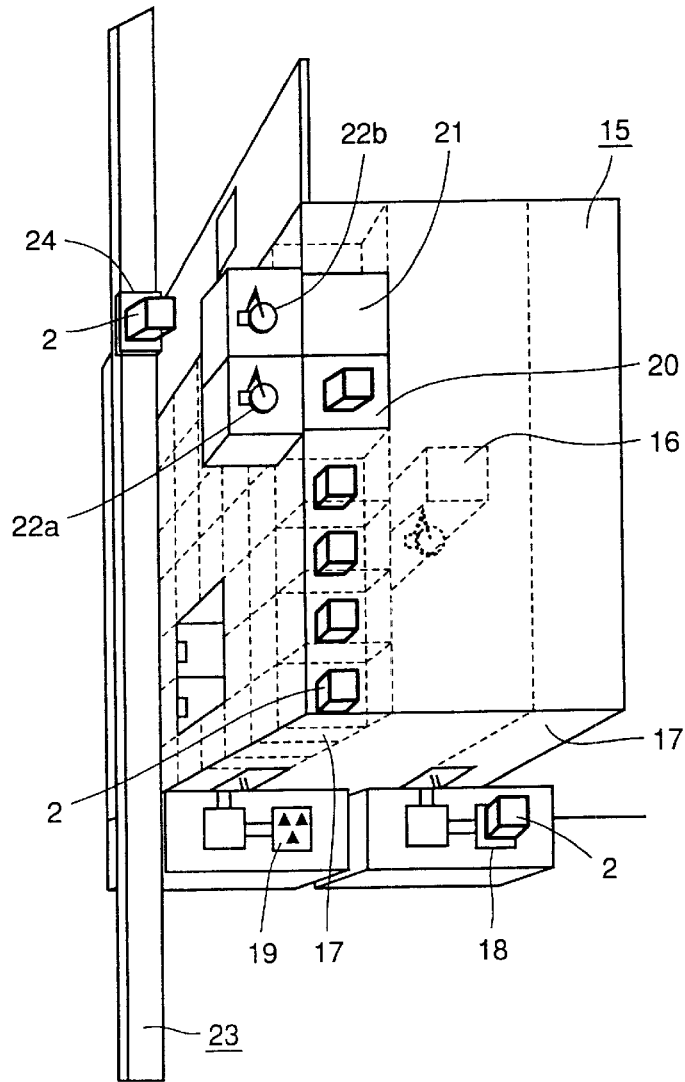
FIG. 5 is a perspective view showing a stocker and an inter-bay transfer apparatus in FIG. 1.

Referring to FIG. 5, stocker 15 includes: a crane 16 for transporting wafer cassette 2; shelves 17 for holding wafer cassette 2; an outlet port 18 for sending wafer cassette 2 to intra-bay transfer apparatus 10; an inlet port 19 for receiving wafer cassette 2 from intra-bay transfer apparatus 10; a departure port 20 for sending wafer cassette 2 to inter-bay transfer apparatus 23; an arrival port 21 for receiving wafer cassette 2 from inter-bay transfer apparatus 23; and loaders 22a and 22b for loading and unloading wafer cassette 2 between departure port 20/arrival port 21 and carriage 24 of inter-bay transfer apparatus 23. In stocker 15 shown in FIG. 5, shelves 17 are located opposite to each other with crane 16 therebetween. Loader 22a is provided for loading and unloading wafer cassette 2 to and from departure port 20 and loader 22b is provided for loading and unloading wafer cassette 2 to and from arrival port 21.

Inter-bay transfer apparatus 23 is formed of a track fixed on the ceiling above the floor on which bay 72 is located in the semiconductor device manufacturing apparatus, and a carriage 24 which is movable along this track. Between carriage 24 of inter-bay transfer apparatus 23 and departure port 20/arrival port 21, wafer cassette 2 holding lot 3 therein is loaded/unloaded by loaders 22a and 22b.

An operation of conveying lot 3 in bay 72 formed of those units as shown in FIGS. 2 to 5 is briefly described below.

Referring to FIGS. 1 to 5, wafer cassette 2 containing lot 3 stored on shelf 17 of stocker 15 is transported first to outlet port 18 by crane 16. Then, intra-bay transfer apparatus 10 moves along guide tape 14 to the front of outlet port 18. Arm 12 of intra-bay transfer apparatus 10 is used to load wafer cassette 2 located on outlet port 18 onto loading platform 13 of intra-bay transfer apparatus 10. Intra-bay transfer apparatus 10 carrying wafer cassette 2 moves along guide tape 14 to the front of load port 5a of processing apparatus 4, i.e. the destination of wafer cassette 2. After arrival of intra-bay transfer apparatus 10 at the front of load port 5a, arm 12 is used to unload cassette 2 on platform 13 of intra-bay transfer apparatus 10 to load port 5a of processing apparatus 4. Processing steps as described above are thereafter performed for semiconductor wafers 1 in processing apparatus 4 to which wafer cassette 2 is fed. Lot 3 having been processed in processing apparatus 4 is housed again in wafer cassette 2 located at load port 5a and then transferred to load port 5a or 5b of another processing apparatus 4 for performing processing of subsequent steps or to inlet port 19 of stocker 15 by intra-bay transfer apparatus 10 according to an operation step described later.

Wafer cassette 2 sent to inlet port 19 of stocker 15 is carried by crane 16 to be stored on shelf 17. Wafer cassette 2 containing lot 3 stored in stocker 15 is transported again to outlet port 18 if the subsequent processing step for the lot 3 is conducted in another processing apparatus 4 in the same bay 72. If the subsequent processing step for the lot 3 is conducted in a processing apparatus 4 in another bay 72, wafer cassette 2 containing the lot 3 is sent to departure port 20 to be transported to a stocker 15 of that another bay 72 by inter-bay transfer apparatus 23.

Figure 6:
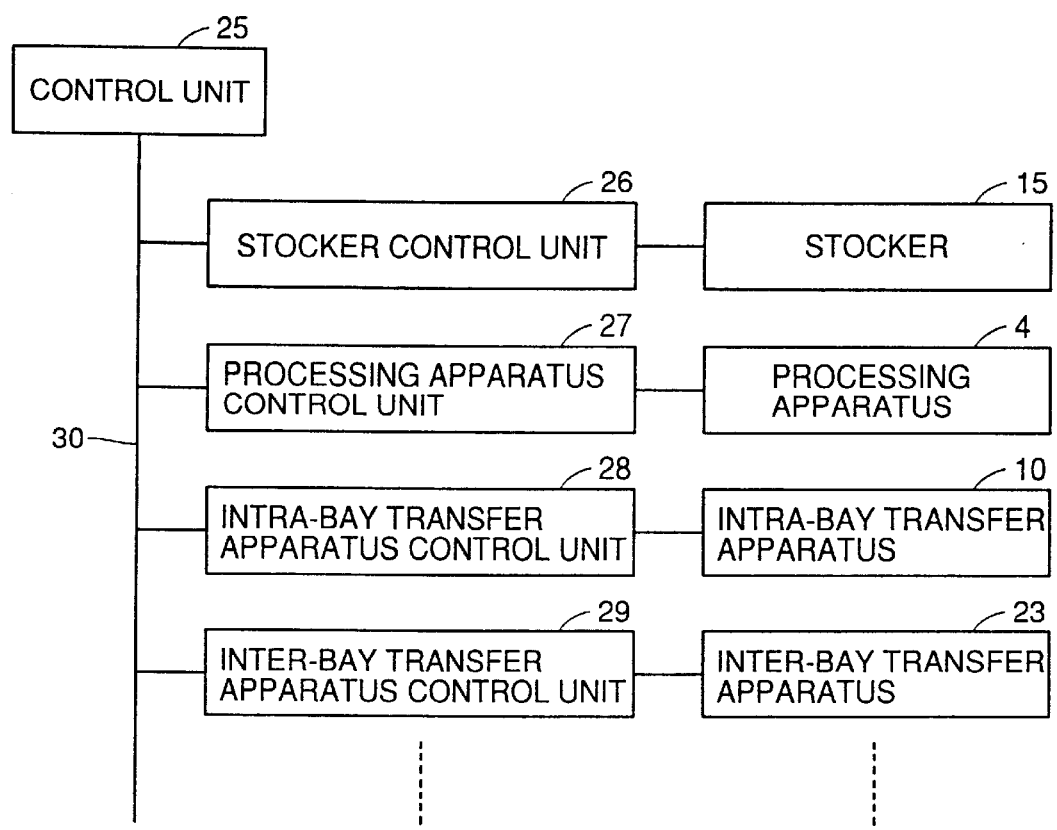
FIG. 6 shows a structure of a control unit of the semiconductor device manufacturing apparatus in FIG. 1.

Referring to FIG. 6, the components of the semiconductor device manufacturing apparatus shown in FIGS. 1 to 5 are controlled by a control unit 25. Stocker 15, processing apparatus 4 for fabricating a semiconductor device, intra-bay transfer apparatus 10 and inter-bay transfer apparatus 23 are controlled respectively by a stocker control unit 26, a processing apparatus control unit 27, an intra-bay transfer apparatus control unit 28 and an inter-bay transfer apparatus control unit 29. Control units 26 to 29 are connected by a communication line 30 to control unit 25 and controlled by control unit 25. The entire semiconductor device manufacturing apparatus is accordingly controlled by control unit 25 and various controls as described below can be conducted for the manufacturing apparatus.

Figure 7:
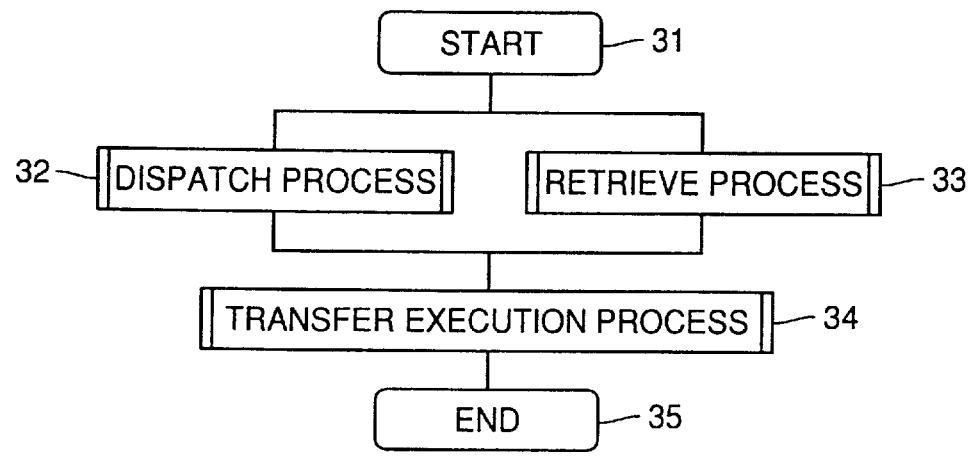
FIG. 7 is a flow chart illustrating a semiconductor lot transport process in the semiconductor device manufacturing apparatus in FIG. 1.

One of various controls performed by control unit 25 is for the lot transfer operation. The lot transfer operation in the semiconductor device manufacturing apparatus according to the present invention includes a dispatch process 32, a retrieve process 33 and a transfer execution process 34 as shown in FIG. 7 similar to those of the conventional apparatus. The lot transfer operation is described below in conjunction with FIG. 7.

Referring to FIG. 7, in the lot transfer operation, a process starts for each of predetermined events (step 31). After the starting, dispatch process (step 32) is conducted in which a lot to be processed next (next-processed lot) in a predetermined processing apparatus 4 is determined. Simultaneously with dispatch process (step 32), retrieve process (step 33) is performed in which a destination of a lot 3 which has been processed in predetermined processing apparatus 4 is determined. Transfer execution process (step 34) is then performed. If lot 3 to be processed next in predetermined processing apparatus 4 is determined in dispatch process (step 32), the next-processed lot 3 is actually transported to the processing apparatus 4 (step 34). If a destination of processed lot 3 is determined in retrieve process (step 33), the processed lot 3 is sent from processing apparatus 4 to the determined destination. The successive processes are completed (step 35) upon completion of the transfer operation. It is noted that nothing is particularly done in transfer execution process (step 34) if the next-processed lot or the destination of the processed lot is not determined in dispatch process (step 32) or retrieve process (step 33).

After the lot transfer operation, if semiconductor wafer cassette 2 containing next-processed lot 3 is fed to load port 5a or 5b of predetermined processing apparatus 4, a processing step is started for semiconductor wafer 1 in processing apparatus 4 by another operation of control unit 25. If processed lot 3 is transported to stocker 15 or the like, another operation of control unit 25 allows the processed lot 3 to be transported to a predetermined place at which a subsequent process step is done.

Figure 8:
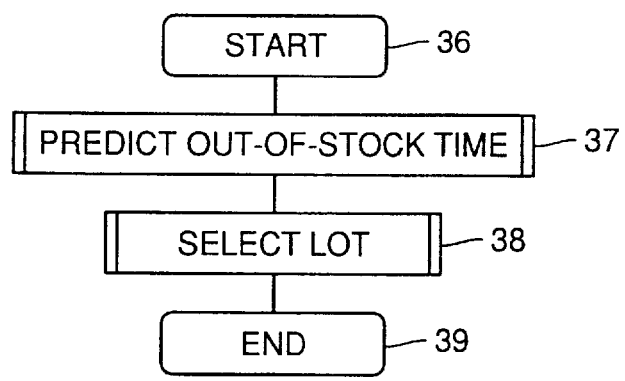
FIG. 8 is a flow chart illustrating a dispatch process in FIG. 7.

Details of dispatch process (step 32) are described in conjunction with FIG. 8.

Referring to FIG. 8, after dispatch process starts (step 36), an out-of-stock time prediction process (step 37) is performed as a prediction step. In out-of-stock time prediction process (step 37), based on the processing status of processing apparatus 4 as described later, it is determined when a lot 3 to be processed next (next-processed lot) should be supplied to processing apparatus 4 in order to start processing of a semiconductor wafer successively after processing of the last semiconductor wafer of a lot being processed currently. Following out-of-stock time prediction step (step 37), a lot selection process (step 38) is conducted as a lot selecting step in which a next-processed lot to be supplied to processing apparatus 4 is selected, and accordingly the entire process is completed (step 39).

Figure 9:
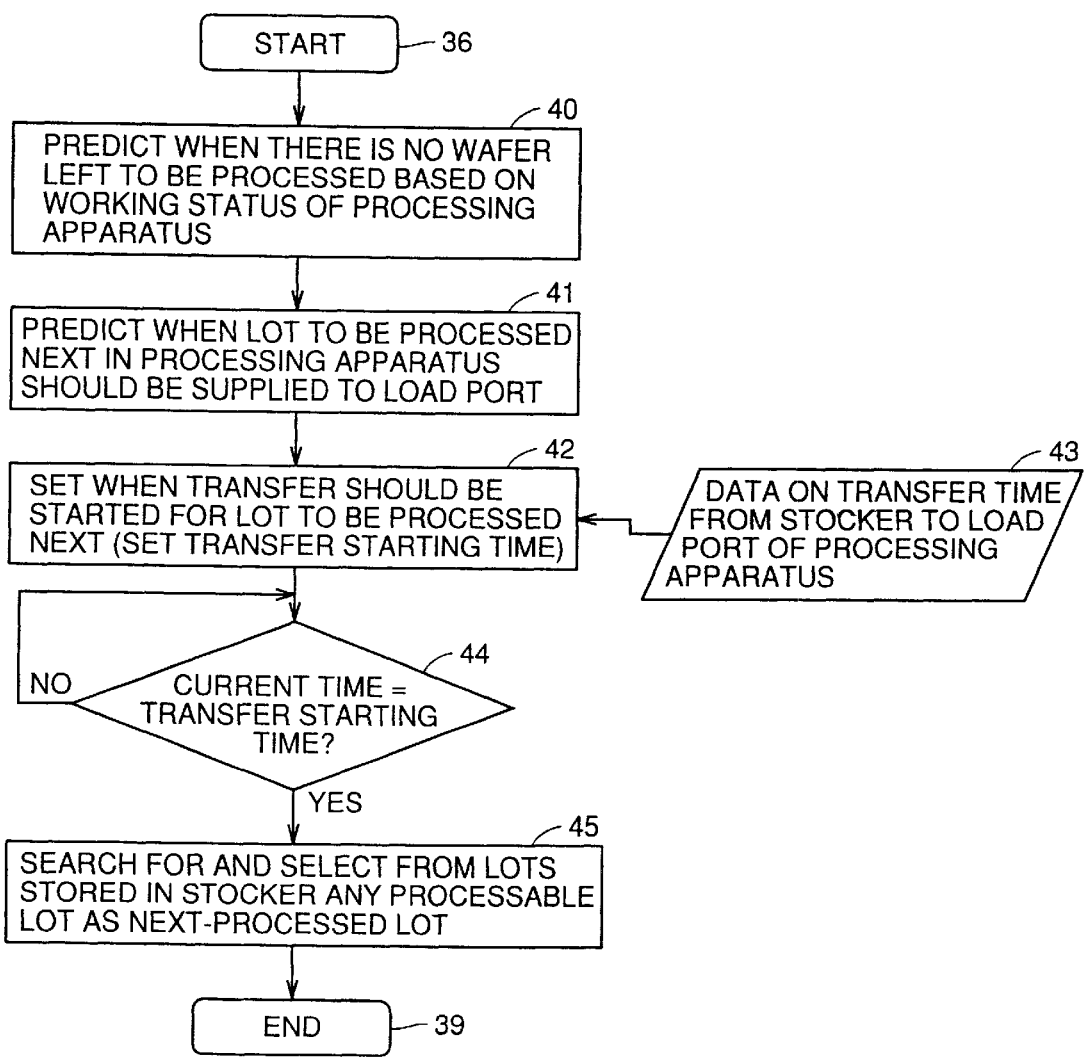
FIG. 9 is a flow chart illustrating one example of the dispatch process in FIG. 8.

An example of the dispatch process illustrated in FIG. 8 is described in more detail in conjunction with FIG. 9.

Referring to FIG. 9, after the process starts (step 36), based on the working status of processing apparatus 4, it is predicted when there is no wafer 1 left in both of the load lock chambers 6a and 6b that is to be processed in that processing apparatus 4 (step 40). Based on the time predicted in step 40, it is predicted when a lot to be processed next in the processing apparatus 4 should be fed to load port 5a or 5b (step 41). Step 40 and step 41 correspond to out-of-stock time prediction process (step 37) in FIG. 8.

Following this, it is determined when transfer of the lot to be processed next in the processing apparatus 4 should be started (transfer starting time) (step 42). In step 42 (time setting step), transfer time data 43 regarding the time required for transporting the next-processed lot from stocker 15 to load port 5a or 5b of processing apparatus 4 is used. Transfer time data 43 is provided in advance. In step 42, the transfer starting time is determined as the time preceding the time, which is predicted in step 41 at which the next-processed lot should be supplied to the load port, by the time required for transfer, for example. Then, it is determined whether the current time is the transfer starting time (step 44). If it is not the transfer starting time, step 44 is repeated until it is the transfer starting time. When the current time reaches the transfer starting time, lots 3 stored in stocker 15a are searched to select therefrom a lot which can be processed in processing apparatus 4 (step 45). In step 45, if there are a plurality of lots which can be processed in processing apparatus 4, one lot to be processed next is determined based on priorities assigned preliminarily to respective lots 3. Steps 42 to 45 correspond to lot selection process (step 38) shown in FIG. 8. The entire process is thereafter completed (step 39).

After the next-processed lot is selected in dispatch process 32 (see FIG. 7), the next-processed lot is transported from stocker 15 to processing apparatus 4 in transfer execution process (step 34). Accordingly, the next-processed lot arrives at processing apparatus 4 at the time predicted in step 41.

In the dispatch process illustrated in FIGS. 8 and 9, the time at which no standby wafer 1 is left in processing apparatus 4 is considered and the next-processed lot is accordingly supplied to load port 5a or 5b of processing apparatus 4 so as to successively process semiconductor wafers 1 in pretreatment chamber 8 and posttreatment chamber 9 without a break. Although a next-processed lot should wait at load port 5a or 5b for a long time in the conventional method in which vacancy of load ports 5a and 5b is detected and immediately wafer cassette 2 storing the next-processed lot is supplied to vacant load port 5a or 5b, no such situation occurs according to the present invention. In other words, even if a next-processed lot which is transported to one processing apparatus 4 and on standby at the load port thereof can be processed in another processing apparatus 4, the next-processed lot must be processed in that one processing apparatus 4 according to the conventional method. According to the present invention, if the next-processed lot is stored in stocker 15 under the condition above, the lot can be transported to that another processing apparatus 4 where the lot can be processed earlier, and accordingly, semiconductor wafers can be processed at earlier timing.

Further, according to the present invention, no lot waits in processing apparatus 4 for a long time as in the conventional method, so that any lot consisting of wafers having a higher priority can properly be fed to processing apparatus 4 to process it. As a result, such a higher priority wafer lot can be processed surely earlier compared with the conventional method.

Figure 20:
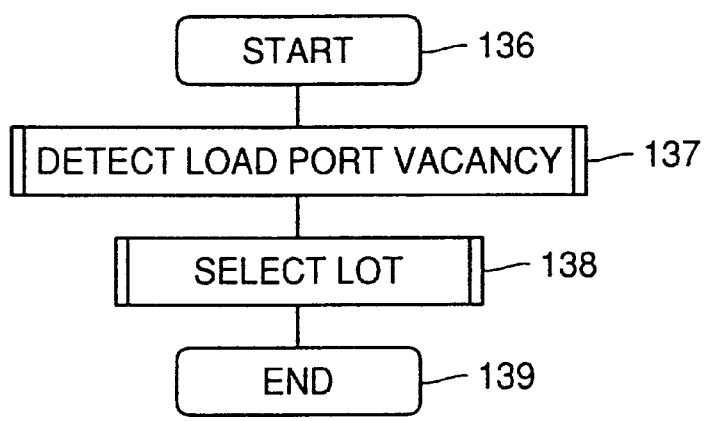
FIG. 20 is a flow chart illustrating details of a dispatch process shown in FIG. 19.
Figure 21:
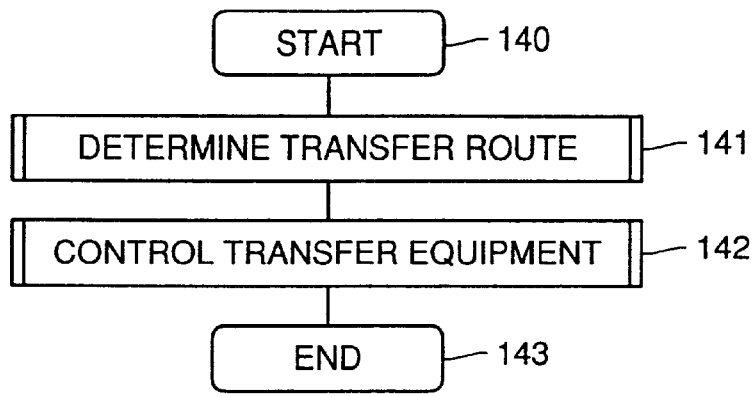
FIG. 21 is a flow chart illustrating details of a transfer execution process shown in FIG. 19.
Figure 22:
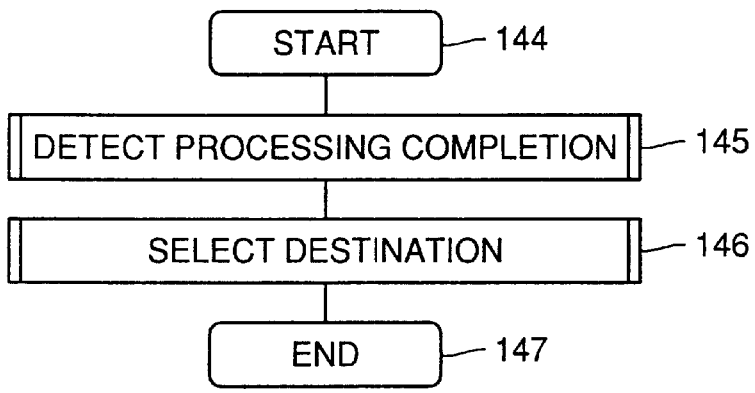
FIG. 22 is a flow chart illustrating details of a retrieve process in FIG. 19.

In addition, referring to FIG. 9, the next-processed lot is selected after the transfer starting time so that the next-processed lot can be determined at the time as close as possible to the processing starting time for a semiconductor wafer. Consequently, the time consumed from selection of the next-processed lot to processing of the next-processed lot can be shortened compared with the conventional method. Further, step 45 for selecting the next-processed lot is conducted at the time as close as possible to the processing starting time for the next-processed lot in processing apparatus 4. Therefore, a lot with a higher priority, which is actually selectable as a next-processed lot at the processing starting time of the next processed lot in processing apparatus 4 but which is not ready for being selected in the selection process (step 138) due to the timing in the conventional method shown in FIG. 20 can be selected as a next-processed lot. The manufacturing term of a lot with a higher priority can surely be shortened.

Since there is no lot waiting for being processed at load lock chambers 6a and 6b of processing apparatus 4, any lot with a higher priority is not interrupted by such a standby lot and can be transported to processing apparatus 4 accordingly. As a result, such a lot having a higher priority can surely be processed in a short manufacturing term.

Second Embodiment

According to the first embodiment, transfer time data 43 regarding the time required to transfer a lot from stocker 15 to processing apparatus 4 is provided in advance. However, if the transfer time in the data is set shorter than the actual transfer time, the time at which transfer from stocker 15 is started for wafer cassette 2 storing lot 3 is delayed. Consequently, there could be no wafer 1 temporarily in processing apparatus 4 that should be fed into pretreatment chamber 8 and the processing apparatus 4 accordingly waits for a lot to be processed. On the contrary, if the transfer time is set longer than the actual transfer time, transfer from stocker 15 is started earlier than the appropriate time. As a result, the next-processed lot transported to load lock chamber 6a or 6b should wait for completion of current processing of a lot for a longer time than a predetermined time. As a result, the advantages of the first embodiment that the manufacturing term of the semiconductor device can be shortened and a lot with a higher priority can be processed in a shorter term could be somewhat lost.

In order to solve such a problem, according to the second embodiment of the invention, a control method of a semiconductor device manufacturing apparatus which is basically identical to that in the first embodiment includes a transfer time measuring process (step 49) as shown in FIG. 10 as a transfer time prediction step in the transfer execution process. The transfer execution process is described below in conjunction with FIG. 10. It is noted that FIG. 10 corresponds to the transfer execution process (step 34) shown in FIG. 7.

Referring to FIG. 10, the transfer execution process is started (step 46) to perform a transfer route determining process (step 47) in which a transfer route of a semiconductor wafer cassette 2 storing a next-processed lot 3 designated in dispatch process (step 32, see FIG. 7) is determined based on the current location of next-processed lot 3 and load port 5a or 5b of a processing apparatus 4 to which the next-processed lot 3 is to be transported. In step 47, if a destination of a lot which has been processed (processed lot) has been determined in retrieve process (step 33, see FIG. 7), a transfer route of the processed lot is similarly determined based on the load port where wafer cassette 2 storing the processed lot is placed and the position of the destination.

In a transfer equipment control process (step 48), intra-bay transfer apparatus 10 and the like are actually controlled to transfer the next-processed lot or the processed lot. At this time, transfer time which is actually required for the transfer operation is measured. As means for measuring such an actual transfer time, a detector for detecting presence of wafer cassette 2 at stocker 15, carriage 1 1 of intra-bay transfer apparatus 10, load port 5a or 5b of processing apparatus 4, or the like is provided. The actual transfer time can be measured by comparing the time detected by the detector when wafer cassette 2 storing next-processed lot 3 departs from the location before transfer and the time detected by the detector when the wafer cassette 2 arrives at the load port of processing apparatus 4 where cassette 2 should be transported. In the transfer time measuring process (step 49), the actual transfer time is measured, and then the measured transfer time is used together with past record data concerning the transfer time required for transfer from the same transfer source to the same destination as those concerning the measured transfer time in order to produce transfer time data as shown in FIG. 11 by a predetermined statistic operation.

Referring to FIG. 11, the transfer time data is formed of three items, i.e. transfer source as a starting point of transfer operation, transfer destination where the transfer operation is completed, and transfer time which is predicted as time required for transfer from the source to the destination. As a method for the statistic operation for calculating the transfer time, averaging of past record data can be employed, for example. Thus obtained transfer time data is written into memory means (not shown). Then, the entire process is completed (step 50). The transfer time data recorded in the memory means can be used as transfer time data 43 shown in FIG. 9 in the first embodiment.

In this way, transfer time data 43 is determined based on the past record data to enhance precision of the transfer time data. The transfer starting time can thus be determined more precisely to avoid the waiting time of processing apparatus 4 due to absence of wafer to be processed therein or avoid the waiting time of the next-processed lot for processing in processing apparatus 4 due to too early supply of the next-processed lot to processing apparatus 4.

Third Embodiment

According to the first and second embodiments of the invention, a lot held in stocker 15 is generally selected as a next-processed lot. On the other hand, according to the third embodiment, a lot being processed in processing apparatus 4 is also selectable as a next-processed lot. The third embodiment of the invention is described below in conjunction with the drawings. It is noted that a lot transfer process in the third embodiment includes a dispatch process (step 32), a retrieve process (step 33) and a transfer execution process (step 34) similarly to those in the first embodiment.

Figures 13, 14:
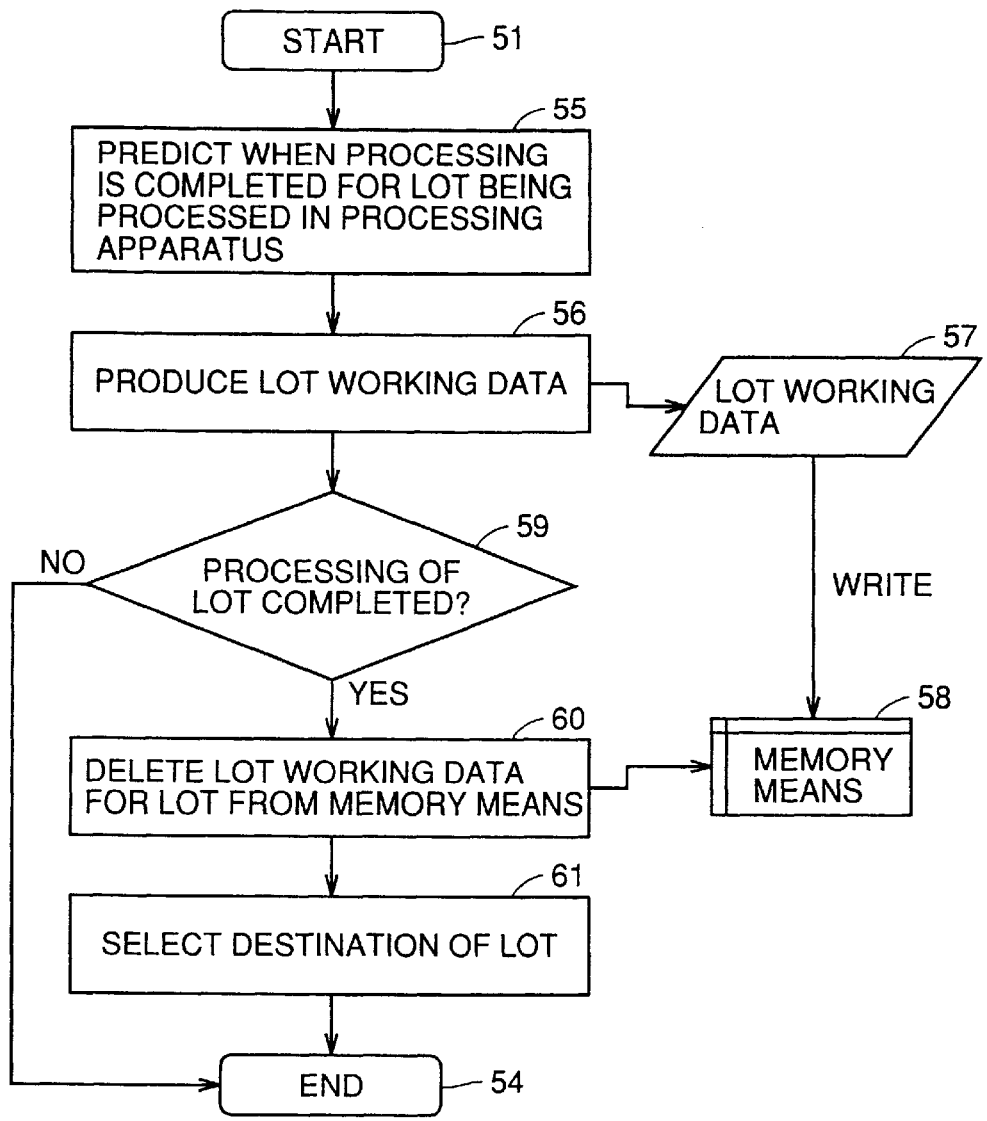
FIG. 13 is a flow chart illustrating one example of the retrieve process in FIG. 12.
FIG. 14 shows a data table indicating data items for lot working data in FIG. 13.

Referring to FIG. 12, retrieve process is started (step 51) to perform a processing completion time prediction process (step 52) as a completion time prediction step and then perform a destination selection process (step 53) to complete the entire process (step 54). The retrieve process shown in FIG. 12 is described in detail in conjunction with FIG. 13. Referring to FIG. 13, after the process starts (step 51), it is predicted when current processing of a lot in processing apparatus 4 is completed (current step completion time)

based on the progress status of the processing (step 55). Step 55 corresponds to the processing completion time prediction process (step 52) in FIG. 12.

Based on the predicted current step completion time, lot working data is produced (step 56). The lot working data produced in step 56 is shown in FIG. 14. Referring to FIG. 14, the lot working data includes data items which are specifically lot ID, next process step, current step completion time and working location. The lot ID represents an identifier for identifying each lot to be processed. The next process step represents a subsequent step determined based on a current working step for a specific lot designated by the lot ID. The current step completion time represents the time when processing of the lot is completed which is predicted in step 55. The working location represents processing apparatus 4 where the lot is currently processed and load ports 5a and 5b of the processing apparatus 4. The lot working data 57 is written into memory means 58.

Then, it is determined if processing of the lot is completed in the processing apparatus (step 59). If completed, the lot working data 57 for that lot is deleted from memory means 58 (step 60). After this, a destination of the processed lot is selected (step 61) as done in the conventional method. In this way, a series of processes are completed (step 54). If processing of the lot is not completed in step 59, steps 60 and 61 are not performed and the entire process is completed as it is.

Figure 15:
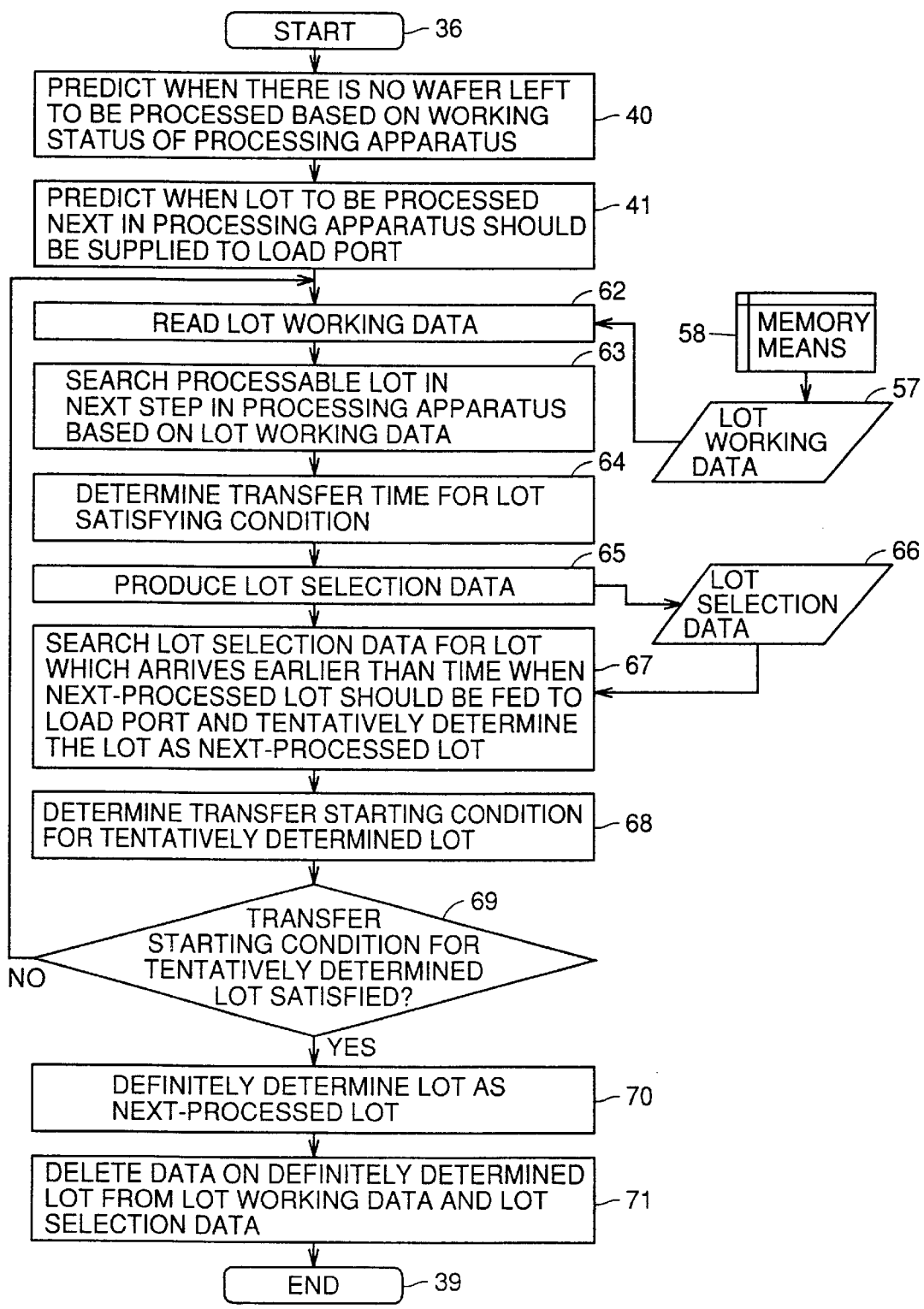
FIG. 15 is a flow chart illustrating one example of the dispatch process in the semiconductor device manufacturing apparatus according to the present invention.

Lot working data 57 written into memory means 58 as shown in FIG. 13 is used in the dispatch process shown in FIG. 15. The dispatch process is described in conjunction with FIG. 15. After the process starts (step 36), it is predicted when there is no wafer-to-be-processed left in the processing apparatus 4 based on the working status in the processing apparatus 4 (step 40), and then it is predicted when a lot to be processed next in the processing apparatus 4 should be supplied to the load port (step 41) as done in the dispatch process shown in FIG. 9.

Lot working data 57 determined in the process step shown in FIG. 13 is read from memory means 58 (step 62). It is noted that lot working data formed of the data items shown in FIG. 14 is also produced for a lot stored in stocker 15 and the lot working data is stored in memory means 58 similarly to the lot working data for a lot being processed. For the lot stored in stocker 15, the lot working data is generated by regarding the current step completion time corresponding to the current time as the time when the lot is stored on shelf 17 of stocker 15. Accordingly, lot working data are prepared for both of the lots stored in stocker 15 and those being processed in order to select a next-processed lot from the lots stored in stocker 15 and the lots being processed in processing apparatus 4.

From the lot working data, a lot is searched for and selected that can be processed in a subsequent step in processing apparatus 4 (step 63). Transfer time is determined for the lot selected in step 63 which meets the condition above (step 64). In step 64, since the working location (transfer source) of the lot selected as processable in the processing apparatus 4 and load ports 5a and 5b of the processing apparatus 4 to which the next-processed lot is to be transferred are known, the transfer time can be determined by using the transfer time data as shown in FIG. 11, for example.

Figures 16, 17:
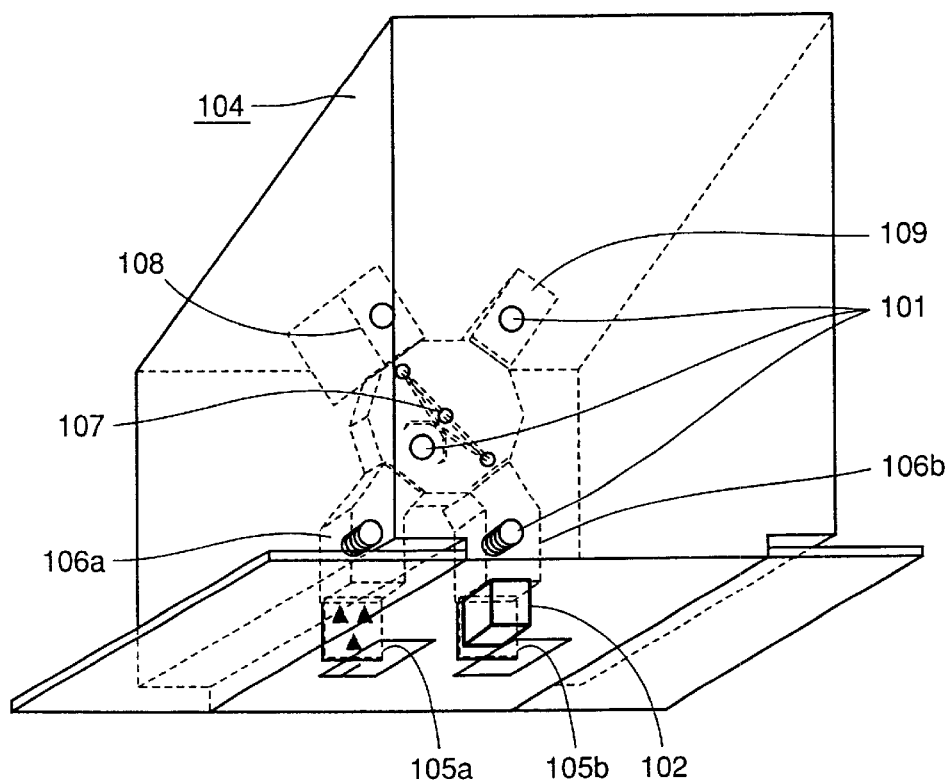
FIG. 16 shows a data table indicating data items for lot selection data shown in FIG. 15.
FIG. 17 is a perspective view showing a processing apparatus in a conventional semiconductor device manufacturing apparatus.
Figure 18:
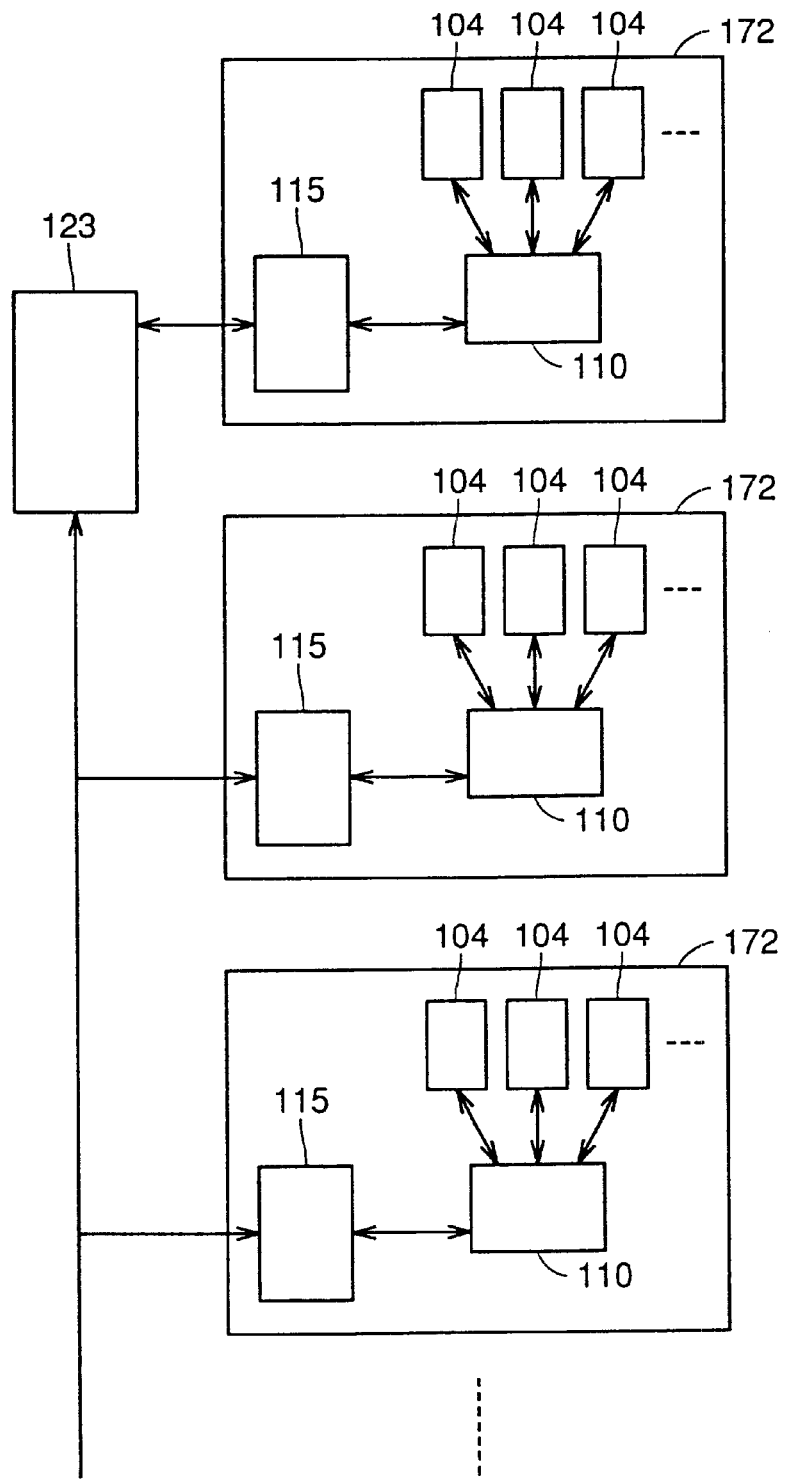
FIG. 18 shows an entire structure of the conventional semiconductor device manufacturing apparatus.
Figure 19:
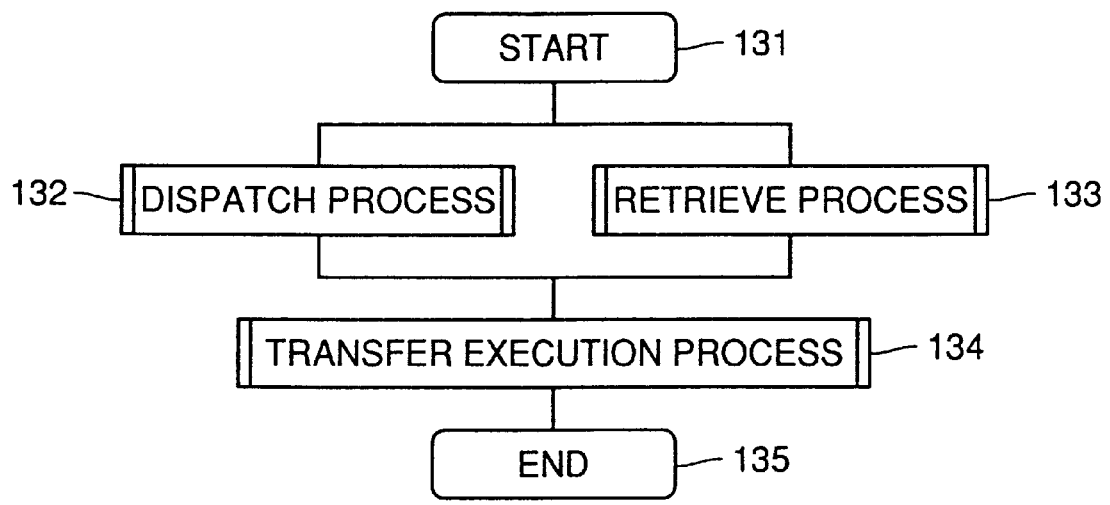
FIG. 19 is a flow chart illustrating a lot transfer process in the conventional semiconductor device manufacturing apparatus.

Lot selection data is then produced (step 65). Lot selection data 66 produced in step 65 has items shown in FIG. 16. Referring to FIG. 16, lot selection data 66 includes, as the lot working data shown in FIG. 11, lot ID, next process step, and current step completion time as data items, and further includes the transfer time determined in step 64 and arrival time determined by adding the transfer time to the current step completion time (time at which transfer is completed of the lot designated by lot ID to a predetermined location of the processing apparatus). Lot selection data 66 is produced for all of the lots which can be transferred as a next-processed lot to the processing apparatus, that are searched for in step 63.

In step 67, based on the time (predicted in step 41) at which a lot to be processed next in the processing apparatus 4 should be fed to the load port of the processing apparatus 4, lot selection data 66 is searched for a lot which arrives earlier than the predicted time (predicted in step 41). The lot which meets this condition is tentatively determined as a next-processed lot. If there are found a plurality of lots satisfying this condition in step 67, one of the lots is tentatively selected according to priorities assigned to respective lots.

A transfer starting condition is determined for the tentatively selected lot (step 68). In step 68, if the tentatively selected lot is being processed in processing apparatus 4, the transfer starting condition is that the processing of the tentatively selected lot is completed. If the tentatively selected lot is stored in stocker 15, the transfer starting condition is that the current time coincides with the transfer starting time which is determined in step 41 as the time preceding the time when a next-processed lot should be supplied to the load port by the transfer time in lot selection data 66.

It is then determined if the transfer starting condition for the tentatively determined lot is satisfied (step 69). If the condition is not satisfied, the steps from step 62 are repeated again. If there is found a lot having a higher priority before the starting condition is met, such a high-priority lot is tentatively selected through steps 62 to 67. Accordingly, if there is a lot with a higher priority, processing of this lot can be proceeded speedily.

If the transfer starting condition for the tentatively determined lot is satisfied in step 69, the tentatively determined lot is definitely determined as a lot to be processed next (next-processed lot) (step 70). After this, data on the definitely determined next-processed lot is deleted from lot working data 57 and lot selection data 66 (step 71), and the entire process is completed (step 39). The lot definitely determined as a next-processed lot is transported to the processing apparatus by the transfer execution process shown in FIG. 10.

Accordingly, the chances to directly send a processed lot from one processing apparatus 4 to another processing apparatus 4 without returning the lot to stocker 15 can be increased. Although the transfer operation must be done twice for transferring lot 3 consisting of wafers 1 from one processing apparatus 4 to another processing apparatus 4 in the conventional method, the present invention requires only one transfer operation. The manufacturing term of a semiconductor wafer or that of a semiconductor device can further be shortened.

In addition, the working load of intra-bay transfer apparatus 10 and the like can be reduced. Reduction in the number of lots stored in the stocker is possible owing to increase in the number of lots directly sent between processing apparatuses, so that the capacity of the stocker can be decreased. The cost for the semiconductor device manufacturing apparatus can be cut accordingly.

An optimum lot can be selected as a next-processed lot since the next-processed lot can also be selected from lots being processed in other processing apparatuses.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of controlling a semiconductor device manufacturing apparatus including a plurality of processing apparatuses successively drawing out and processing a plurality of semiconductor wafers which constitute a process lot, said processing apparatuses having a standby port where a next-processed lot which is to be processed after said process lot is on standby, said manufacturing apparatus further including a stocker holding a lot to be transported to said standby port, comprising the steps of:

predicting time when processing starts for a last semiconductor wafer among semiconductor wafers which were on standby in said processing apparatus and consequently there is no standby wafer left in said processing apparatus;

setting transfer starting time when transfer of a next-processed lot to said standby port is started to enable processing of semiconductor wafers to start successively after said last semiconductor wafer is processed, said starting time being set by using said time when there is no standby wafer left in said processing apparatus;

selecting said next-processed lot; and transferring said next-processed lot to said processing apparatus at or after said transfer starting time.

2. The control method according to claim 1, wherein said next-processed lot is selected at or after said transfer starting time in said step of selecting said next-processed lot.

3. The control method according to claim 1, further comprising the step of predicting transfer time required for said transferring step, wherein said transfer time predicted in said transfer time predicting step is used to set said transfer starting time in said transfer starting time setting step.

4. The control method according to claim 3, wherein said step of predicting the transfer time includes the steps of:

measuring actual transfer time required for said transferring step; and predicting said transfer time using said actual transfer time.

5. The control method according to claim 1, further comprising the step of predicting processing completion time when processing is completed for another process lot including a semiconductor wafer being processed in another processing apparatus, wherein said processing completion time is used in said next-processed lot selecting step to select from said another process lot and said process lot held in said stocker a next-processed lot which can be transferred to said standby port of said processing apparatus to enable processing of semiconductor wafers to start successively after said last semiconductor wafer is processed in said processing apparatus.

6. A semiconductor device manufacturing apparatus including a plurality of processing apparatuses successively drawing out and processing a plurality of semiconductor wafers which constitute a process lot, said processing apparatuses having a standby port where a next-processed lot which is to be processed after said process lot is on standby, said manufacturing apparatus further including a stocker holding a lot to be transported to said standby port, comprising:

prediction means for predicting when processing starts for a last semiconductor wafer among semiconductor wafers which were on standby in said processing apparatus and consequently there is no standby wafer left in said processing apparatus;

time setting means for setting transfer starting time when transfer of a next-processed lot to said standby port is started to enable processing of semiconductor wafers to start successively after said last semiconductor wafer is processed, said starting time being set by using said time when there is no standby wafer left in said processing apparatus;

lot selecting means for selecting said next-processed lot; and transfer means for transferring said next-processed lot to said processing apparatus at or after said transfer starting time.

7. The semiconductor device manufacturing apparatus according to claim 6, wherein said lot selecting means selects said next-processed lot at or after said transfer starting time.

8. The semiconductor device manufacturing apparatus according to claim 6, further comprising transfer time prediction means for predicting transfer time required to transfer said next-processed lot to said processing apparatus, wherein said time setting means uses said transfer time predicted by said transfer time prediction means to set said transfer starting time.

9. The semiconductor device manufacturing apparatus according to claim 8, wherein said transfer time prediction means includes:

means for measuring actual transfer time required to transfer said next-processed lot by said transfer means to said processing apparatus; and means for predicting said transfer time using said actual transfer time.

10. The semiconductor device manufacturing apparatus according to claim 6, further comprising means for predicting processing completion time when processing is completed for another process lot including a semiconductor wafer being processed in another processing apparatus, wherein said lot selecting means uses said processing completion time to select from said another process lot and said process lot held in said stocker a next-processed lot which can be transferred to said standby port of said processing apparatus to enable processing of semiconductor wafers to start successively after said last semiconductor wafer is processed in said processing apparatus.

* * * * *